United States Patent [19]

Lee et al.

[11] Patent Number: 5,808,354
[45] Date of Patent: Sep. 15, 1998

[54] LEAD FRAME FOR A SEMICONDUCTOR DEVICE COMPRISING INNER LEADS HAVING A LOCKING MEANS FOR PREVENTING THE MOVEMENT OF MOLDING COMPOUND AGAINST THE INNER LEAD SURFACE

[75] Inventors: Jin Hyuk Lee, Suwon; Hyeon Jo Jeong, Songtan; Oh Sik Kwon, Seoul, all of Rep. of Korea

[73] Assignee: Samsung Electronics Co., Ltd., Kyungki-do, Rep. of Korea

[21] Appl. No.: 544,407

[22] Filed: Oct. 10, 1995

Related U.S. Application Data

[63] Continuation-in-part of Ser. No. 345,449, Nov. 21, 1994, abandoned.

[51] Int. Cl.[6] .................................................. H01L 23/495
[52] U.S. Cl. ...................... 257/666; 257/784; 257/786; 257/787
[58] Field of Search .................................... 257/666, 786, 257/784, 787, 780, 781

[56] References Cited

U.S. PATENT DOCUMENTS

| | | |
|---|---|---|
| 4,629,804 | 12/1986 | Gilder, Jr. et al. . |
| 4,791,472 | 12/1988 | Okikawa et al. . |
| 4,862,246 | 8/1989 | Masuda et al. . |
| 4,987,474 | 1/1991 | Yasuhara et al. . |
| 5,191,403 | 3/1993 | Nakazawa . |
| 5,296,744 | 3/1994 | Liang et al. ............................. 257/784 |
| 5,358,906 | 10/1994 | Lee ......................................... 257/666 |

FOREIGN PATENT DOCUMENTS

| | | | |
|---|---|---|---|
| 6-48951 | 3/1986 | Japan | ................................. 257/666.3 |
| 61-48951 | 3/1986 | Japan . | |
| 63-42155 | 2/1988 | Japan . | |
| 63-100760 | 5/1988 | Japan . | |
| 1-25448 | 1/1989 | Japan | ................................. 257/666.3 |

OTHER PUBLICATIONS

A Probabilistic Approach for Predicting Thermal fatigue Life of Wire Bonding in Microelectronics, Jun Ming Hu et al, Journal of Electronic Packaging, Sep. 1991. vol. 113/275, pp. 275–285.
Propagation Mechanism and Metallurgical Characterization of First Bond Brittle Heel Cracks in Alsi wire, Ray Fitzsimmons et al, 1992 IEEE, vol. 15, No. 6, Dec. 1992, pp. 1081–1085.
The Influence of Contamination on Aluminum–Gold Intermetalics, H.K.Charles, Jr. et al, 1982 IEEE/Proc, IRPS, pp. 128–139.
Brittle Cracks Induced in Alsi Wire by the Ultrasonic Bonding Tool, R.T. Fitzsimmons et al, 1991 IEEE, pp. 854–858.
Fracture Mechanics Life Prediction for Microscale Components—With Application to Wire Bonding D.O. Harris et al, 1991 IEEE/IRPS, pp. 35–43.
Development of an Alternative Wire Bond Test Technique, Michael Pecht et al, 1994 IEEE, Part A, vol. 17, No. 4, Dec. 1994, pp. 610–615.

*Primary Examiner*—Tom Thomas
*Assistant Examiner*—Roy Potter
*Attorney, Agent, or Firm*—Cushman Darby & Cushman Intellectual Property Group of Pillsbury Madison & Sutro LLP

[57] ABSTRACT

A semiconductor chip package includes a semiconductor chip, a lead frame including a plurality of inner leads each having a wire bonding point on a top surface, bonding wires for electrically interconnecting the semiconductor chip to each of the plurality of inner leads, and a molding compound for encapsulating the semiconductor chip and the inner leads. Each of the plurality of inner leads of the lead frame has a means for locking movement of the molding compound against the top surfaces of the inner leads, and the locking means, for example a linear groove, down set feature of the inner lead or second wire ball, is placed in close proximity to the wire bonding.

5 Claims, 8 Drawing Sheets

LEAD FRAME FOR A SEMICONDUCTOR DEVICE COMPRISING INNER LEADS HAVING A LOCKING MEANS FOR PREVENTING THE MOVEMENT OF MOLDING COMPOUND AGAINST THE INNER LEAD SURFACE

REFERENCE TO RELATED APPLICATION

This is a Continuation-In-Part of application Ser. No. 08/345,449, Filed Nov. 21, 1994, abandoned upon the filing hereof.

BACKGROUND OF THE INVENTION

1. Technical Field of the Invention

The present invention relates to a lead frame used in packaging semiconductor chips, and more particularly to a lead frame comprising inner leads which have a locking means located in close proximity to a wire bonding point on the surface of the inner leads, for suppressing movement of a molding compound against inner lead surfaces and thereby reducing wire heel cracking failure.

2. Description of Prior Art

Recently, as the density of microelectronic devices rapidly increases, the size of the chip also becomes larger, while the microelectronic package tends to be thinner and smaller. As a result, the number of I/O pins required for the package device greatly increases (e.g., 64, 100, 208 and more), and thus the inner package leads become finer and longer. Accordingly, the lead frame which includes the finer and longer inner leads has increasing contact surface with a molding compound. This may cause more serious problems such as package cracking, delamination or debonding of the molding compound from the lead frame, and wire heel cracking, due to the thermal and mechanical property differences between the lead frame and the molding compound. To overcome such problems, the bonding strength between the molding compound and the lead frame must be reinforced.

Figure 1A:
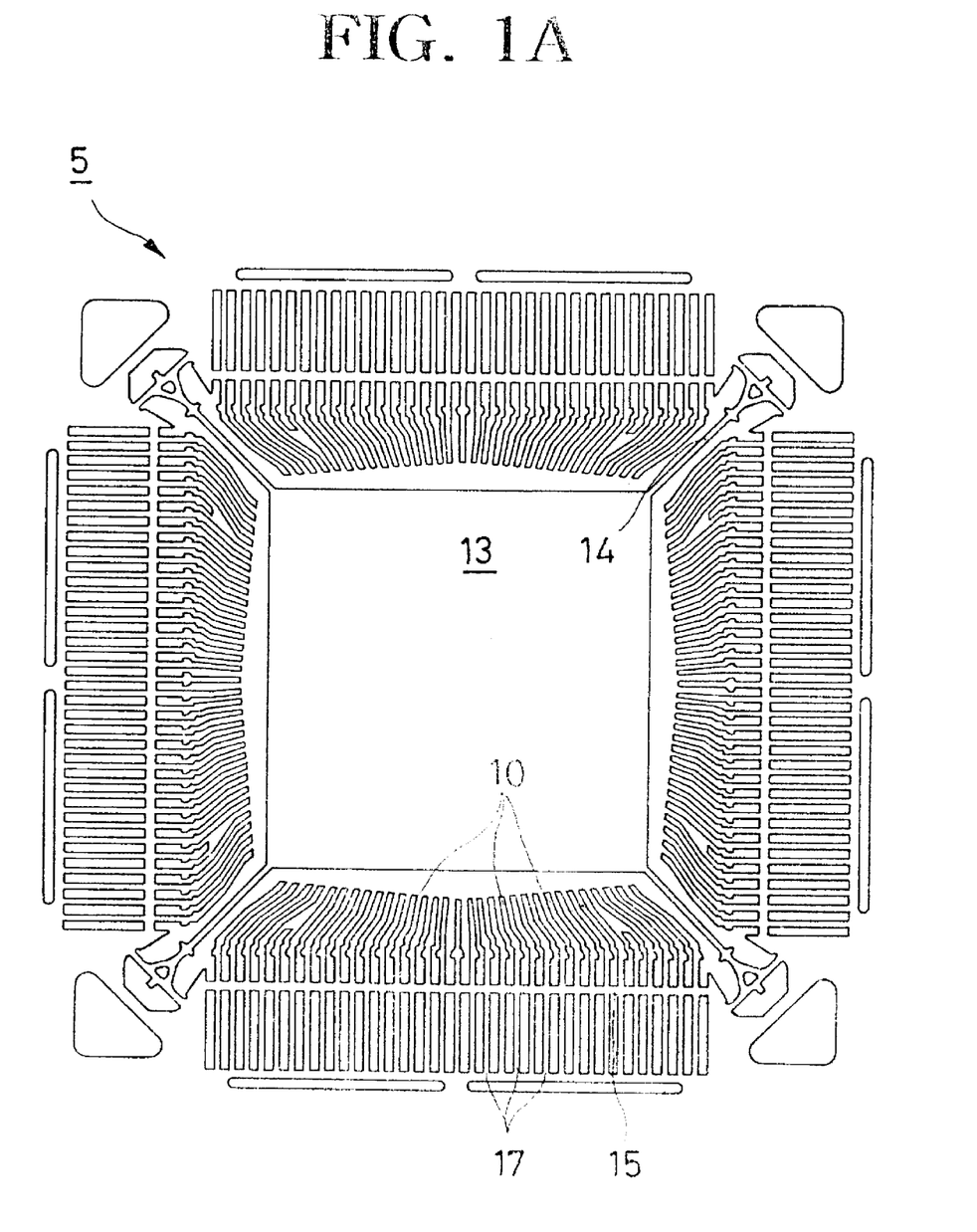
FIGS. 1A to 1C show a conventional lead frame of which inner leads have depressions and/or through holes.
Figure 1B:
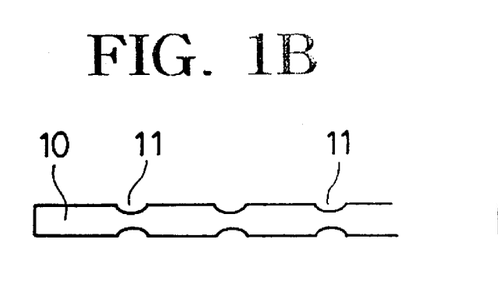
Figure 1C:
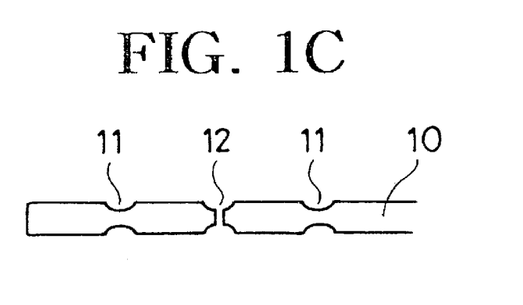

FIGS. 1A–1C show a conventional lead frame which is disclosed in U.S. Pat. No. 4,862,246, and has a plurality of depressions and/or through holes in the front and back surfaces of inner package leads.

Referring to FIG. 1A, a lead frame 5 suitable for a Flat Plastic Package type semiconductor device has many inner leads 10 as shown in FIG. 1A. The lead frame 5 comprises a die pad 13 on which a semiconductor chip (not shown) is to be mounted, tie bars 14 connected with four corners of the die pad 13, dam bars 15 for preventing molding compound from flowing over, and outer leads 17. In order to improve the adhesion and mechanical strength between a molding compound and the leads, Masachika et. al. form depressions 11, each having a surface diameter of 0.1 mm, in both sides of inner leads 10 of the lead frame as shown in FIG. 1B. The depressions 11 are formed by an isotropic etching method. A sealer of an epoxy resin or the like flows to set in the depressions 11 so that the adhesion and mechanical strength between the sealer and the inner leads 10 of the lead frame is enhanced.

The through hole 12 of FIG. 1C is formed by over-etching technique. In combination with the depressions and the through hole, adhesion strength can be further enhanced by the action similar to the aforementioned one while a similar mechanical strength is retained. Although the prior art depressions or through holes in the inner leads can contribute to the enhancement of adhesion and mechanical strengths between the molding compound and the lead frame, wire heel cracking, which is a major factor of failure when pin number is greater than one hundred, can not be effectively prevented since microscopic movement or sliding of the molding compound against the lead frame surface near a wire bonding area is a main cause of such wire heel cracking. And the width of inner leads near their wire bonding point is too small to accommodate the formation of depressions or through holes.

SUMMARY OF THE INVENTION

It is an object of the present invention to provide a lead frame which can reduce the relative displacement between the molding compound and the lead frame due to their different centers of thermal expansion and contraction, and which thereby can reduce bonding wire heel cracking.

In order to accomplish the object, the present invention provides a semiconductor chip package comprising a semiconductor chip, a lead frame including a plurality of inner leads each having a wire bonding point on a top surface thereof, bonding wires for electrically interconnecting the semiconductor chip to each of the plurality of inner leads, and a molding compound for encapsulating said semiconductor chip and the inner leads, wherein improvement in that each of the plurality of inner leads of the lead frame has a locking means for suppressing a movement of the molding compound against the top surfaces of the inner leads near their wire bonding area, and the locking means is located in close proximity to the wire bonding point of the inner leads.

BRIEF DESCRIPTION OF THE DRAWINGS

Other objects, features and advantages of the invention will appear more fully from the following detailed description thereof taken in connection with the accompanying drawings, in which.

DETAILED DESCRIPTION OF THE INVENTION

Generally speaking on the mechanisms of wire heel cracking, an excessive reduction in heel cross-sectional area caused by the edge of the bonding tool gives rise to a high localization of stress at the bonding knee which corresponds to the junction between the heel and the wire span. After molding, the molding stress is superimposed on such localized stress. As the package undergoes thermal cycling for lifetime and reliability testing of the packaged device, the bonding knee will rupture due to the plastic strain accumulated during thermal cycling.

And, the relative displacement between the molding compound and the lead frame, due to their different centers of thermal expansion or contraction, plays an important role in the wire heel cracking.

The mechanism of wire heel cracking has been disclosed in several papers: for example, "Hu, J., Pecht, M., and Dasjupta, A., 1991, 'A Probabilistic Approach for Predicting Thermal Fatigue Life of Wire Bonding In Microelectronics,' ASME Journal of Electronic Packaging, p. 275", made known that in addition to ductile fracture of the wire due to thermal fatigue, for the Al-1%Si bonding wire, the 1st bonding heel area is degraded by vibrations in the low amplitude and high frequency of the ultrasonic bonding tool during the 2nd bonding, and consequently brittle fracture occurs. And Kasem et al. suggested that reduction in the area of the inner lead results in decreasing the plastic strain amplitude of thermal fatigue and, as a result, leads to a reduction in wire heel cracking, in their paper "High-Performance Power Package for Power-Integrated Circuit Devices, IEEE Trans. Components, Hybrids, and Manufacturing Technology, vol. 12, 1991, p. 521".

Figure 2A:
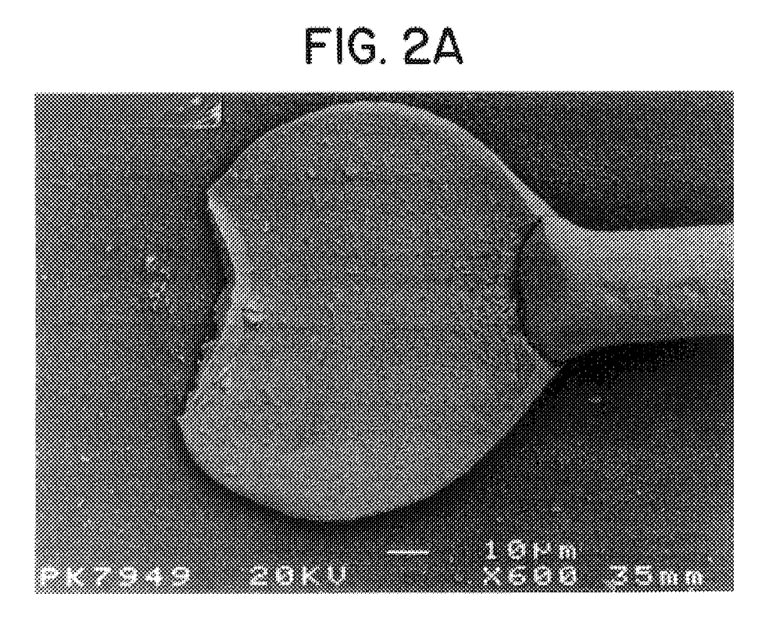
FIGS. 2A and 2B are SEM micrographs of a typical wire heel cracking phenomenon occurring around a heel area and at a place distant from the heel area, respectively.
Figure 2B:
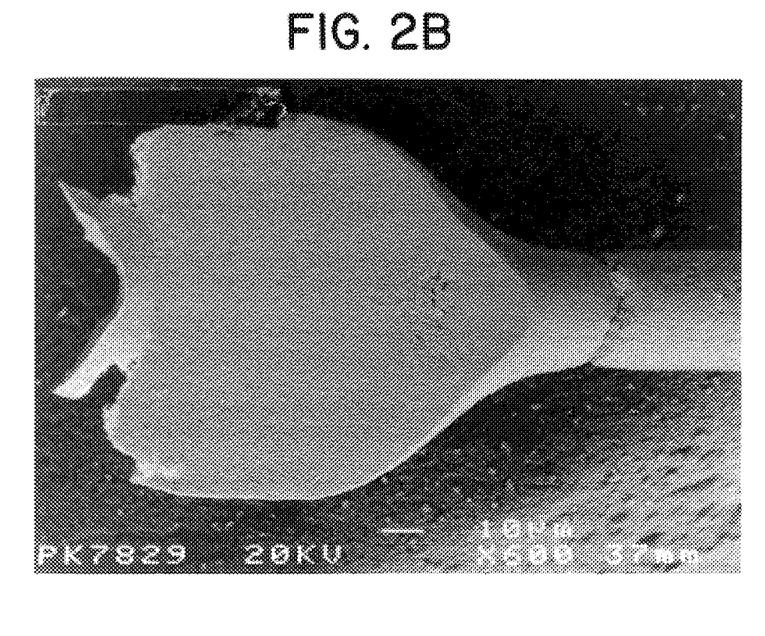

FIGS. 2A and 2B are SEM micrographs of a typical wire heel cracking phenomenon. These figures illustrate areas where the bonding wire heel cracking mostly occurs, i.e., around the heel area as in FIG. 2A, and 20–100 $\mu$m distant from the area as in FIG. 2B.

The wire heel will be cracked during the cooling portion of the thermal cycle ranged from e.g., −6° C. to 150° C., because stress of the thermal cycle is most serious during the cooling portion.

The stresses along the bonding wire, especially at the heel area, can be effectively analyzed in terms of the relative displacement between the molding compound and the lead frame due to thermal expansion mismatch.

Figure 3A:
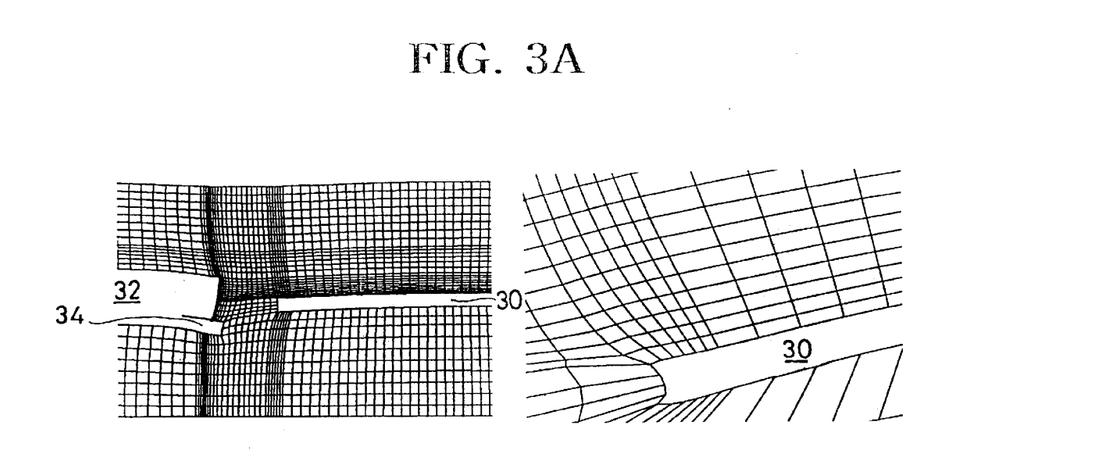
FIGS. 3A and 3B show the movement of molding compound against lead frame surface in cases of the lead frame with A) higher and B) lower thermal expansion coefficients than the molding compound, respectively.
Figure 3B:
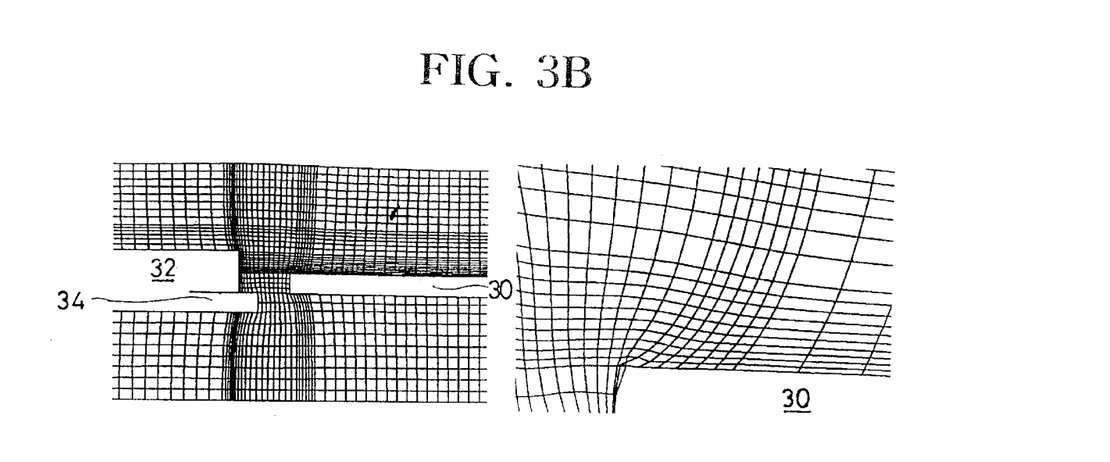

FIGS. 3A and 3B show the movement of the molding compound against a lead frame surface. In FIGS. 3A and 3B, the reference numeral 30 indicates an inner lead portion and 32, 34 represent a semiconductor chip and a lead frame pad (or die pad), respectively.

As can be seen from these figures, the stress status of the bonding wire can be determined by the distortion of the element in the molding compound surrounding the bonding wire. In the case of lead frame with a higher thermal expansion coefficient than the molding compound, tensile stress along the bonding wire can be expected during the cooling portion of the thermal cycling as shown in FIG. 3A. On the other hand, in the case of a lead frame with a lower thermal expansion coefficient than the molding compound, compressive stress can be expected as shown in FIG. 3B.

Since the temperature range of thermal cycling is generally below the stress free temperature e.g., 175° C., tensile stress plays an important role in the whole process of thermal cycling in the former case, while compressive stress does in the latter case. As a matter of fact, fatigue fracture of the wire is more likely with tensile stress than compressive stress. Therefore, bonding wire heel cracking rarely occurs in the case of a lead frame with a lower thermal expansion coefficient than the molding compound. From this point of view, the lead frame made of alloy 42 has an advantage over a copper alloy lead frame, because the coefficient of thermal expansion of copper alloy is about 16.3 ppm/°C. and that of alloy 42 is about 45 ppm/°C. However, for the purpose of cost cutting and enhancement in solder joint reliability of the package, the lead frame made of alloy 42 tends to be substituted more often for the lead frame made of copper alloy lately.

Figure 4A:
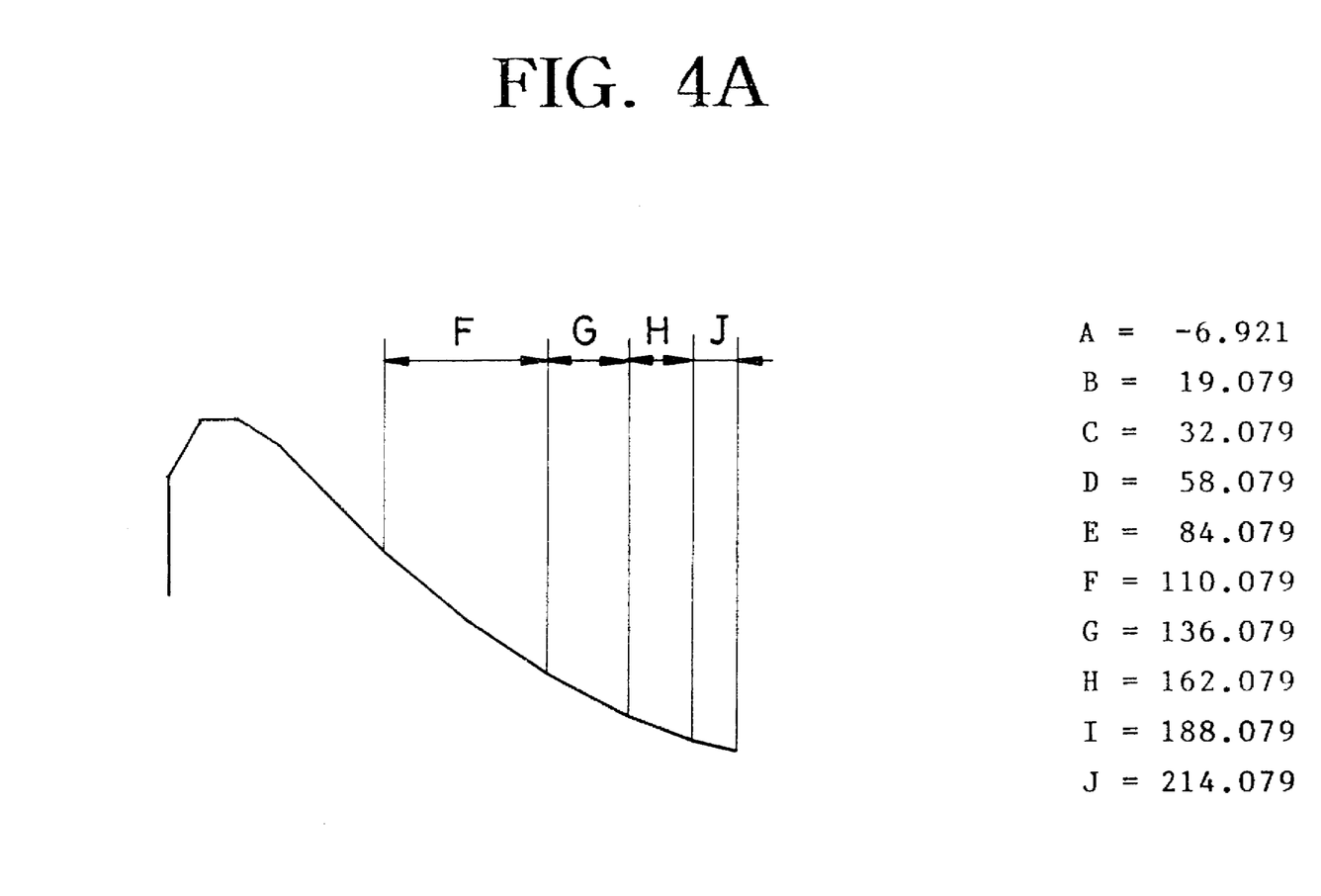
FIGS. 4A and 4B show the stress level on the bonding wire obtained from the model with actual materials of a lead frame such as copper alloy and alloy 42 respectively, when the molding compound and the lead frame are partially debonded.
Figure 4B:
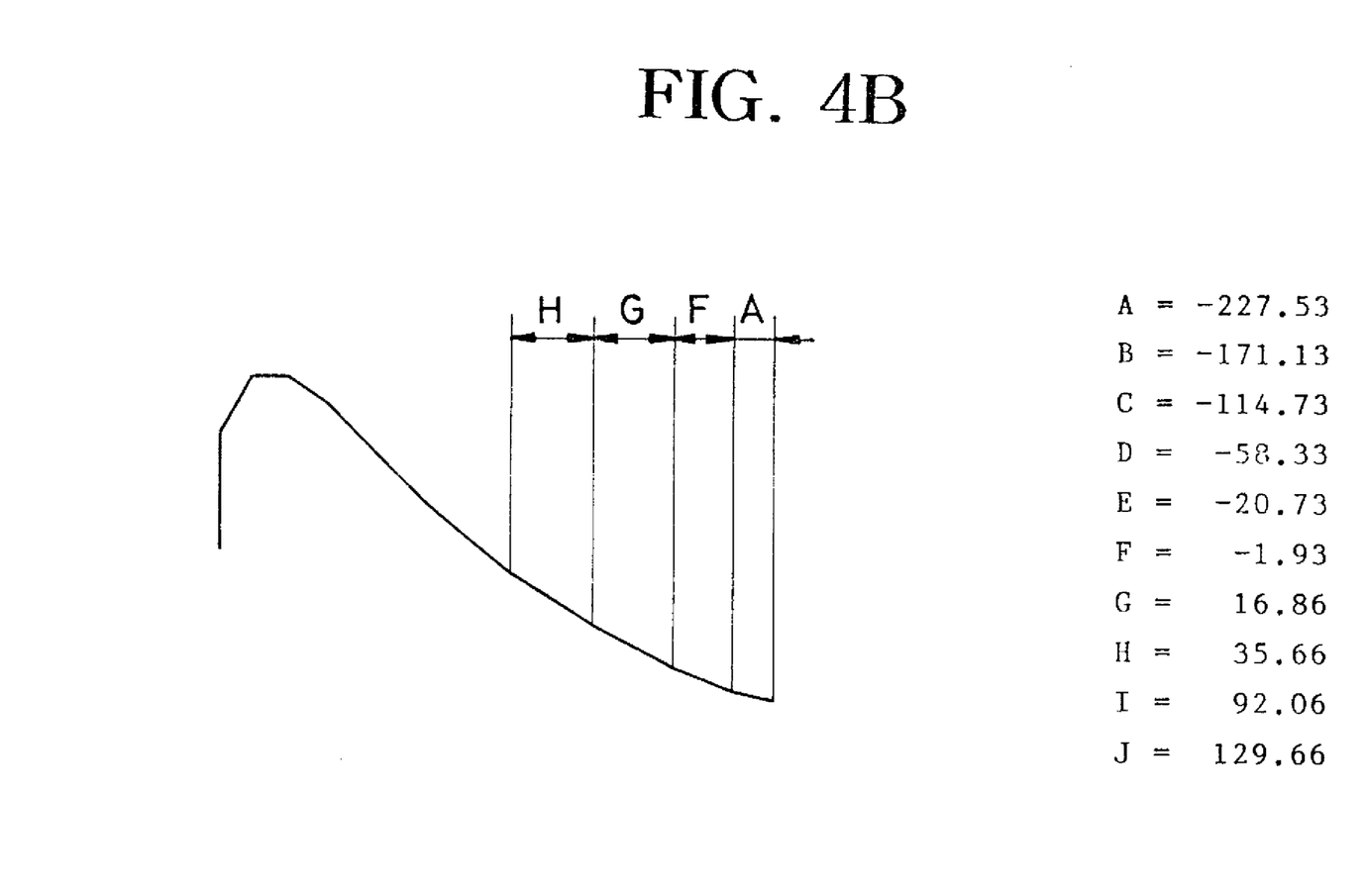

FIGS. 4A and 4B show the stress level on the bonding wire obtained from the model with actual material properties of the constituents of the package, when the molding compound and the lead frame are partially debonded. Copper alloy and alloy 42 lead frames are adopted for the lead frame with lower and higher thermal expansion coefficient than the molding compound respectively. In FIG. 4, the stress level is divided into nine sections of which section A represents minimum stress level and section J represents maximum stress level. For simplicity only four sections corresponding to stress levels near wire heel area are shown in FIGS. 4A and 4B. The minus sign of the stress value represents a compressive stress while the plus sign represents a tensile stress.

In the case of the copper alloy lead frame, the maximum tensile stress J=214.079 [Mpa] is observed at the heel area as shown in FIG. 4A. On the other hand, in the case of the alloy 42 lead frame, the maximum compressive stress A=−227.53 [Mpa] acts at the same location where the maximum tensile stress is observed for the copper alloy lead frame as shown in FIG. 4B. These results have been obtained by considering that partial debonding occurs along the interface up to a distance 300 $\mu$m from the end of inner lead.

When the molding compound and inner lead frame are completely debonded along an interface thereof, the lead frame slips against the molding compound during the cooling process. The extent of the slippage depends on the frictional force along the debonded interface. However, the frictional force is too low to obstruct the lead frame slippage against the molding compound. As a result, the displacement between the molding compound and the lead frame at the debonded area is much larger than that in the case of partial debonding shown in FIGS. 4A and 4B.

On the other hand, when the molding compound and the lead frame are perfectly bonded, maximum tensile (with copper alloy lead frame) and compressive stress (with alloy 42 lead frame) are observed at the element just above the heel area. This is due to the fact that a thin layer of the molding compound stuck to the lead frame moves in the same direction as the lead frame does. As a result, the most possible site for fatigue fracture of the wire during thermal cycling may be expected at just above the heel area. However, since the wire at the heel area was already damaged by the edge of the bonding tool, considering both microcracks resulted from such damage and the stress concentration around the heel, the heel area is also the most likely site for fracture of the wire.

On the other hand, in the case of the alloy 42 lead frame, the maximum compressive stress acts at the same location where the maximum tensile stress is observed for the copper alloy lead frame. However, a low level of tensile stress is also observed at the heel area. This can be also explained by the direction of the movement of the thin layer of the molding compound on the lead frame as mentioned above. It is clear that the bonding wire is fractured by the compressive stress resulting from the relative displacement of the molding compound in the case of the alloy 42 lead frame. On the other hand, the stress on the wire heel area can be reduced by adjusting the bonding point on the inner leads and the angle of the bonding wire to the inner lead surface as understandable from the following <table>.

<TABLE>

| bonding point | angle of the bonding wire | wire heel stress [Mpa] |
|---|---|---|
| 65 µm | 25.3° | 28.2 |
| 100 µm | 13.0° | 22.1 |
| 118 µm | 10.9° | 20.6 |
| 135 µm | 8.9° | 18.4 |

As shown in <Table>, when the bonding point is farther from the inner lead edge, the angle of the bonding wire becomes smaller and the wire heel stress is reduced. However, since the amount of variation of the bonding point and the wire bonding angle is confined to a small extent, significant reductions in wire heel stress can not be expected.

Judging from the mechanism of wire bonding heel cracking described here-in-before, one of the appropriate ways for improving bonding wire heel cracking is to reduce the relative displacement between the molding compound and the lead frame.

Figures 5, 6, 7, 8, 9:
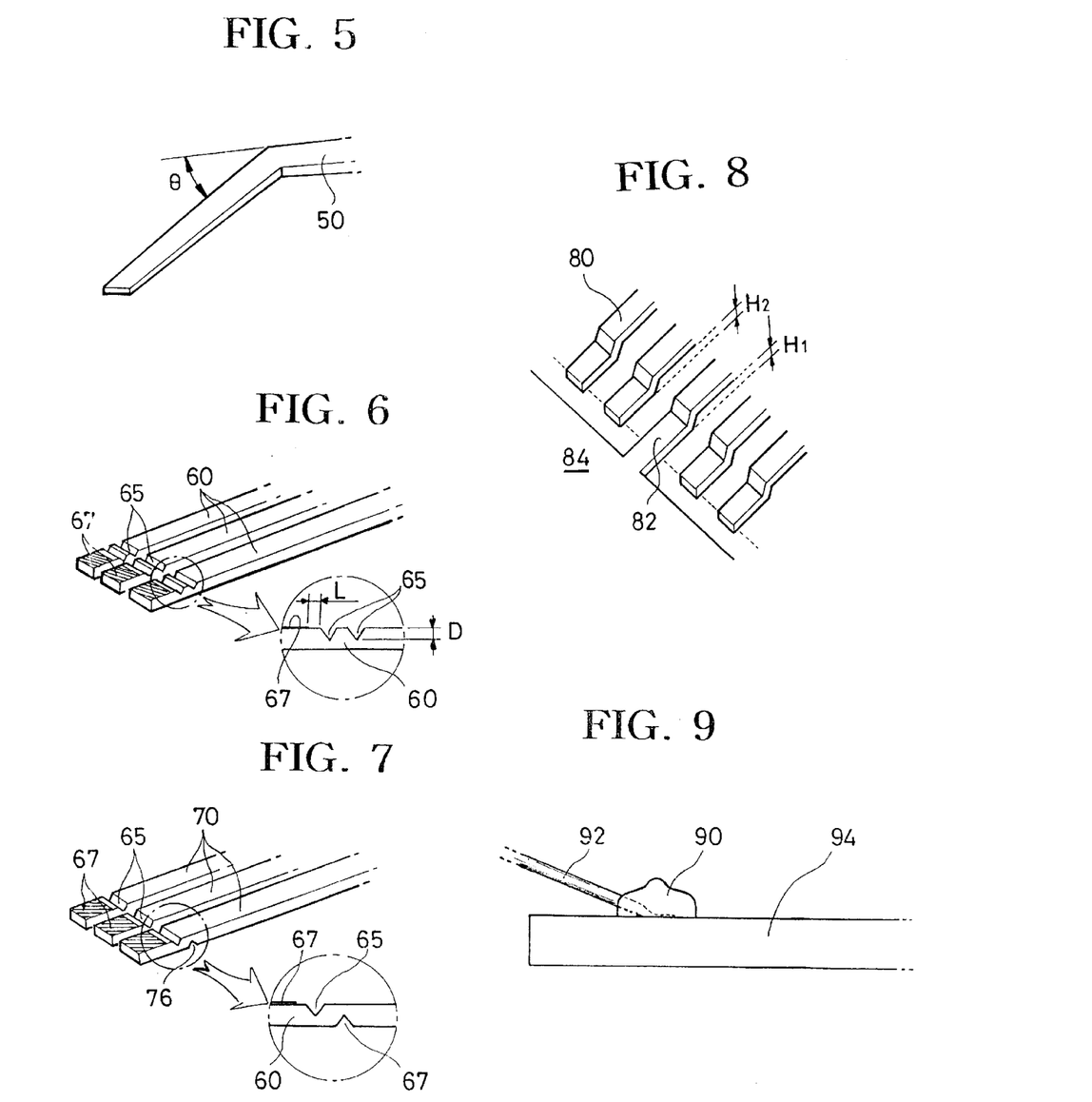
FIG. 5 shows one exemplary structure of a lead frame of which inner leads are bent with an angle.
FIG. 6 shows a structure of inner leads according to the first embodiment of the present invention in which grooves are formed near the wire bonding point of the inner leads.
FIG. 7 shows another embodiment of the lead frame structure according to the present invention.
FIG. 8 shows still another embodiment of the lead frame structure according to the present invention in which a small down set is formed near the inner lead tip area.
FIG. 9 shows still another embodiment of the lead frame structure according to the present invention in which a second wire ball is formed to cover the wire heel portion.

FIG. 5 shows one exemplary structure of a lead frame which reduces the relative displacement between the molding compound and the lead frame, in which inner lead 50 is bent with an angle Θ. If the inner lead frame 50 has an angle in a plane as shown in FIG. 5, the center of thermal expansion and contraction will move. Strictly speaking, the center may be separated into two : one is at the straight part, and the other is at the bent part. Of course, they interact with each other.

For the exemplary model with an angle in the inner lead frame, the stress at the heel area is insignificantly affected at small angles, while it is remarkably reduced at angles of 60° or more. However, when the number of I/O pins of the package device increases to more than one hundred, it is very difficult to secure enough space to form such a large angle in an inner lead frame.

FIG. 6 shows a structure of inner leads according to one embodiment of the present invention. The grooves 65 on the surface of the inner lead 60 play a role of mechanical interlocking at the debonded interface, and thus can hinder movements of the molding compound and lead frame at the debonded interface.

According to the inventors' experiments in which a copper alloy lead frame was used, stress exerted on the heel area was reduced to 172 [Mpa] from 214 [Mpa], when the molding compound and the lead frame were partially debonded. On the other hand, when the molding compound and the lead frame were perfectly bonded, the heel area of the grooved inner lead frame had a stress of 48 [Mpa] which is smaller than 77 [Mpa] as in the original non-grooved inner lead frame. In other words, the grooves on the surface of the lead frame gave rise to about a 40% and 20% reduction in the stress at the heel area in cases of perfect bonding and partial debonding respectively.

It is preferable to form the grooves having a depth (D) of 50 µm and a distance (L) from the wire bonding point being within a range of 200 µm–500 µm. The wire bonding area 67 may be plated with a suitable material such as silver (Ag), or be subjected to a coining process. The grooves of the present invention can be linearly formed on the surface of the inner lead frame by a stamping process. When the linear grooves are formed on the top surface of the inner leads by stamping, the inner leads may be upwardly warped to cause poor coplanarity of the leads and, in a worst case, wire bonding failure.

In consideration of these problems, second grooves 76 may be also formed on the back surface of the inner leads by a stamping process as shown in FIG. 7.

FIG. 8 is another embodiment of the present invention. A die pad 84 on which a semiconductor chip (not shown) will be mounted by an adhesive is supported by a supporter or tie bar 82. The tie bar 82 may be connected to the die pad 84 at four corners of the die pad 84 or at center of each side of the die pad 84. The tie bar 82 is depressed near the connection point with the die pad 84. The depth H1 of depressed down set of the tie bar can be determined upon the slope of bonding wire. A plurality of inner leads 80 arranged in both sides of the tie bar 82 have down set of which the depth H1 is preferably the same as that of the die pad down set H2.

In this model, the down set process of the inner leads can be advantageously performed at the same time of as the stamping process for the die pad down set. The down set, like the aforementioned stamped linear groove, serves as a mechanical interlock at the debonded interface of the molding compound and the inner lead surface, and can prevent the movement of the molding compound.

It should be noted that the down set should be formed as near as possible to the wire bonding area but a space for wire bonding should be secured.

An alternative way for reducing the relative displacement between the molding compound and the lead frame is to form a wire ball 90 to cover the wire heel area as shown in FIG. 9. Referring to FIG. 9, the wire 92 is wedge bonded on the inner lead 94. The second wire ball 90 which covers the wire heel area and its surroundings, can prevent the movement of the molding compound like the grooves and down set of the other embodiments of the invention.

According to the inventors' experiment, the resultant stress at the heel area obtained from the second wire ball model was significantly reduced from 214 [Mpa] to 28 [Mpa], when the molding compound and the lead frame are partially debonded.

Figure 10:
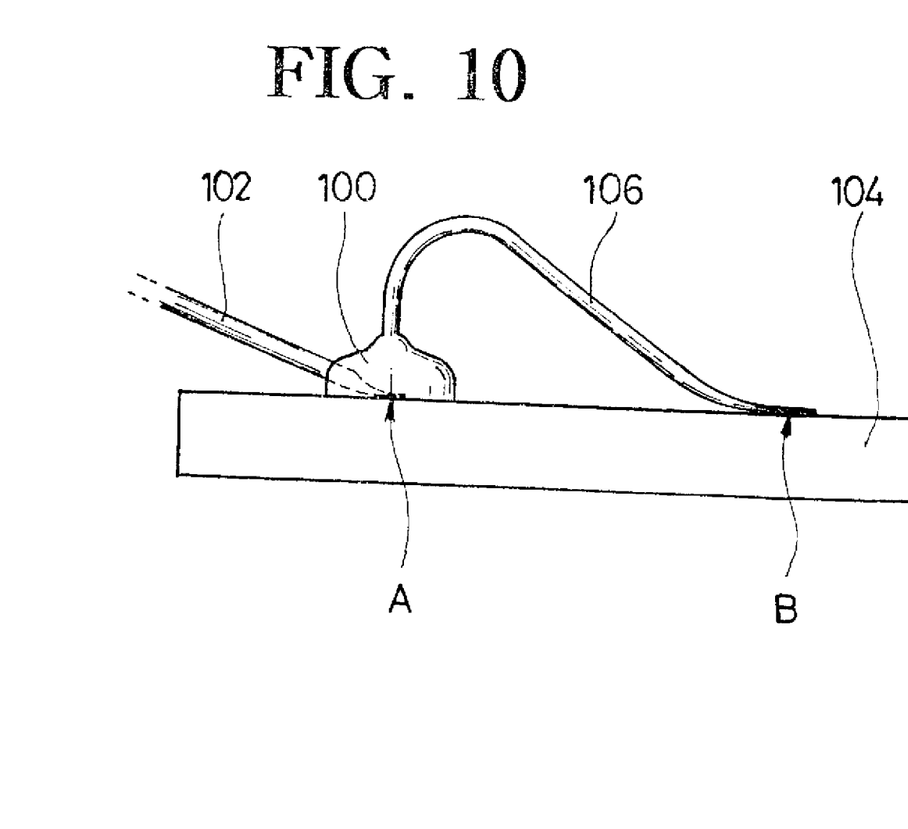
FIG. 10 is a modified embodiment of the model shown in FIG. 9, in which second wire is connected between the second wire ball and inner lead.

FIG. 10 is a modified embodiment of the model shown in FIG. 9. The bonding wire 102 is wedge bonded and the second wire ball 100 is formed to cover the bonding wire heel area of the inner lead 104. One remarkable finding from FIG. 10, compared with FIG. 9, is that additional wire 106 is connected between the second wire ball 100 and the inner lead 104.

In this model, the wire heel area is not only more resistant to the tensile or compressive stresses of the molding compound but also may be exposed to more weakened force of the molding compound since the interconnected additional wire 106 hinders the movement of the molding compound along the interface to the lead frame. And because the additional wire 106 is bonded to points A and B as shown in FIG. 10, reduction of lead frame inductance, which is one factor of electrical noise, can be expected.

For these embodiments described with reference to FIGS. 9 and 10, Ag plating performed on the tip area of the inner lead for wire bonding process should secure more space than conventional one. But it is sufficient to make wider the plating area wider by several tens of micro meters, and the second wire balls 90 and 100 can be formed on several selected inner leads rather than on all inner leads.

The invention described in sufficient detail that it can be practiced by a person of ordinary skill in the art. When such a person reads the foregoing description, alternatives and equivalents, within the spirit and intent of the invention, will be apparent. Accordingly, it is intended that the scope of the invention be limited only by the following claims.

We claim:

1. A semiconductor chip package comprising:

a semiconductor chip;

a lead frame including a plurality of inner leads each having a wire bonding point on a top surface thereof said bonding point being flattened by Ag plating performed on said inner leads;

bonding wires for electrically interconnecting said semiconductor chip to each of said plurality of inner leads;

a plurality of wire balls respectively formed on said wire bonding point of each of said plurality of inner leads and covering a wire heel area of a corresponding one of said bonding wires connected between said semiconductor chip and said inner leads; and a molding compound for encapsulating said semiconductor chip and said inner leads, said wire balls locking a movement of said molding compound against said top surface of each of said inner leads near said wire bonding point such that wire heel cracking of said bonding wires is prevented even when said molding compound and said lead frame are debonded during thermal cycling of said semiconductor chip package.

2. A semiconductor chip package comprising:

a semiconductor chip;

a lead frame including a plurality of inner leads each having a wire bonding point on a top surface thereof;

bonding wires for electrically interconnecting said semiconductor chip to said plurality of inner leads;

a plurality of wire balls respectively formed on certain of said plurality of inner leads on said bonding point and covering a wire heel area of corresponding bonding wires connected between said semiconductor chip and said certain inner leads, said wire balls being connected to said certain inner leads by an additional wire; and a molding compound for encapsulating said semiconductor chip and said inner leads.

3. The semiconductor chip package according to claim 2, wherein said wire balls and said additional wires lock movement of said molding compound against said top surface of said inner leads near said wire bonding point.

4. The semiconductor chip package according to claim 3, wherein said wire balls and said additional wires lock movement of said molding compound such that wire heel cracking of said bonding wires is prevented even when said molding compound and said lead frame are debonded during thermal cycling of said semiconductor chip package.

5. The semiconductor chip package according to claim 2, wherein said bonding point of said inner leads is flattened by Ag plating performed on said inner leads.

* * * * *